(12) United States Patent
Inoue

(10) Patent No.: US 6,221,764 B1
(45) Date of Patent: Apr. 24, 2001

(54) MANUFACTURING METHOD OF SEMICONDUCTOR DEVICE

(75) Inventor: Ken Inoue, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/277,928

(22) Filed: Mar. 29, 1999

(30) Foreign Application Priority Data

Mar. 30, 1998 (JP) .................................................. 10-084110

(51) Int. Cl.[7] .......................... H01L 21/336; H01L 21/44
(52) U.S. Cl. .......................... 438/649; 438/303; 438/533; 438/584; 438/592; 438/682; 438/301
(58) Field of Search .................................... 438/303, 655, 438/681, 683, 906, 649, 584, 592, 597, 620, 558, 533, 301, 682

(56) References Cited

U.S. PATENT DOCUMENTS

| | | | |
|---|---|---|---|
| 5,830,775 | * 11/1998 | Maa et al. ............................. | 437/193 |
| 5,874,342 | * 2/1999 | Tsai et al. ............................. | 438/301 |
| 5,989,988 | * 11/1999 | Iinuma et al. ........................ | 438/592 |
| 6,008,111 | * 12/1999 | Fushida et al. ....................... | 438/584 |

FOREIGN PATENT DOCUMENTS 9-251967   9/1997   (JP) .

* cited by examiner

*Primary Examiner*—Mathew Smith
*Assistant Examiner*—Igwe U. Anya

(57) ABSTRACT

After a cobalt film 12 and a titanium nitride film 13 as a barrier film against oxygen are formed over the surfaces of impurity diffusion layers 9, 10 on a silicon substrate 1, a first heat treatment is performed at a temperature below 400° C., forming a $Co_2Si$ film 31. Following this, the titanium nitride film and the unreacted cobalt film are removed, using a mixed solution of sulfuric acid and hydrogen peroxide and then another heat treatment is performed at a temperature in a range of 700~900° C. and thereby forms a $CoSi_2$ film. According to the present invention, the generation of spikes of cobalt silicide which may pierce the diffusion layers is well suppressed and, thus, the leakage current is well-controlled so that good transistor characteristics as well as high reliability are attained.

14 Claims, 4 Drawing Sheets

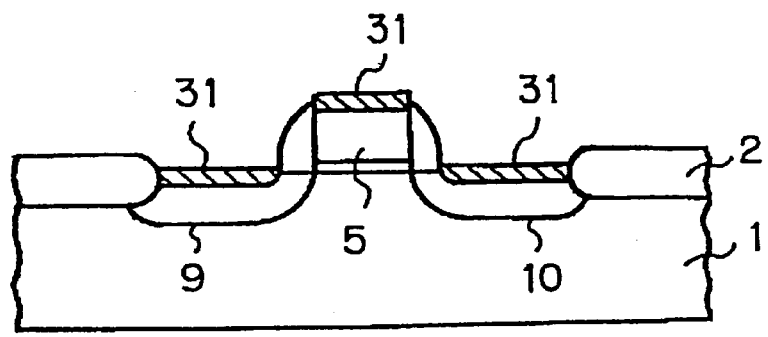
FIG. 3A
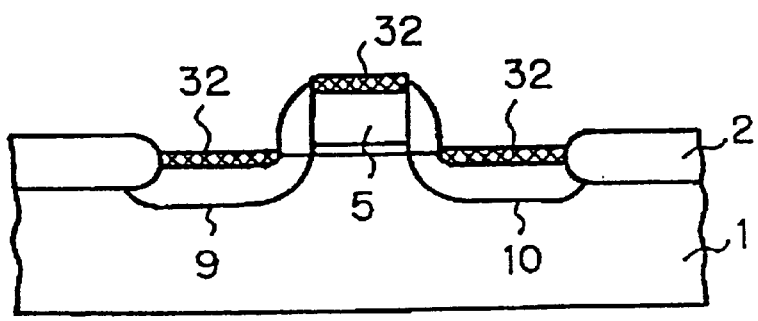
FIG. 3B
FIG. 4
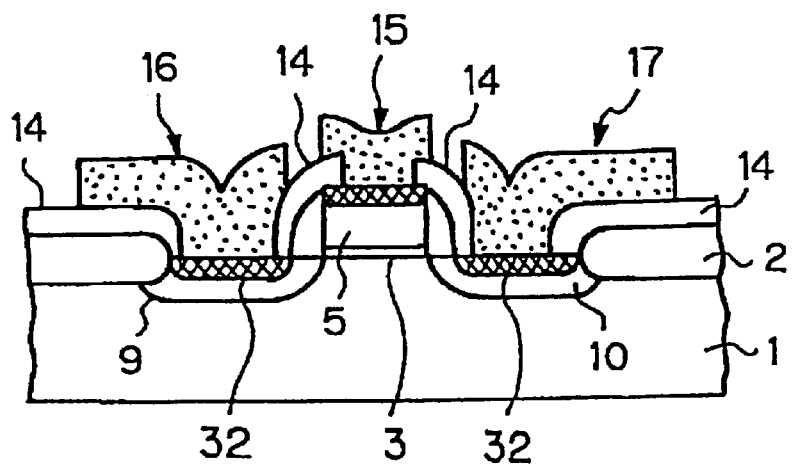

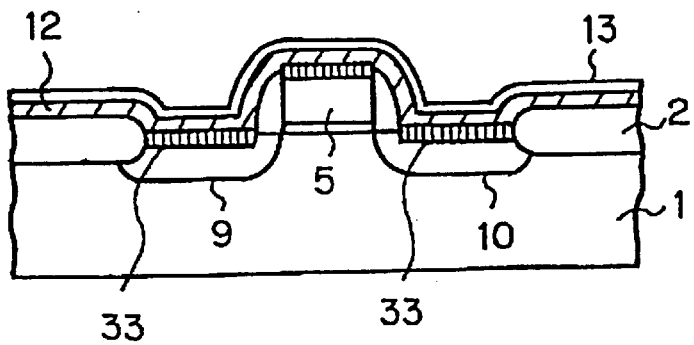
FIG. 5A
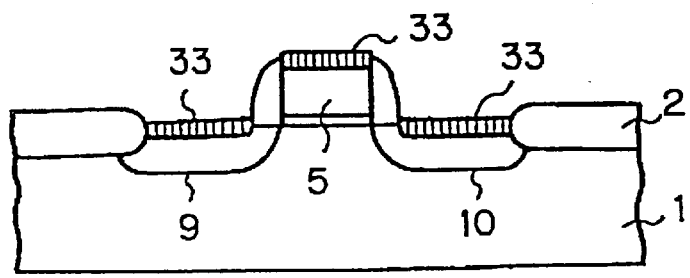
FIG. 5B
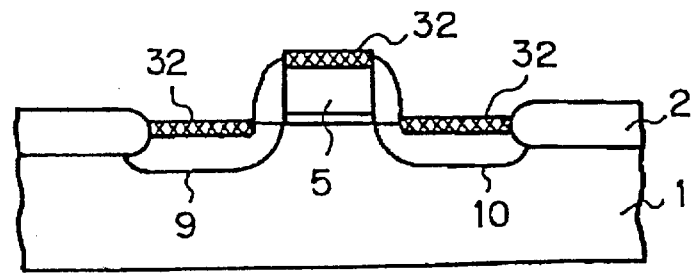
FIG. 5C
FIG. 6 PRIOR ART
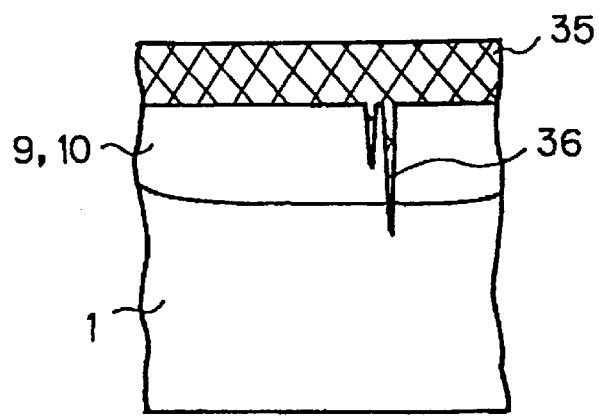

MANUFACTURING METHOD OF SEMICONDUCTOR DEVICE

BACKGROUND OF THE INVENTION

1. Field of the Invention

The present invention relates to a method of manufacturing a semiconductor device and more particularly to a method of manufacturing a semiconductor device which has a salicide (self-aligned-silicide) process.

2. Description of the Prior Art

In the art of semiconductor devices, there have been, at all times, demands to achieve higher integration and further miniaturization. On the other hand, when the gate length of MOSFET (Metal-Oxide-Semiconductor Field Effect Transistor) becomes equal to or less than 0.35 µm or so, problems such as a short channel effect take place. If diffusion layers are made thin to suppress the short channel effect, the resistance of diffusion layers increases. Accordingly, to overcome these problems, there has been being tried the application of a salicide process wherein a cobalt film is grown on the surfaces of a source layer, a drain layer and polysilicon forming a gate electrode, and then cobalt silicide is formed by heating and thereby the resistance thereof is lowered.

However, as shown in FIG. 6, from a bottom section of a cobalt silicide layer formed on the surface of a source layer 9 and a drain layer 10 on a silicon substrate 1, cobalt silicide may grow abnormally in the form of spikes and pierce through the source layer 9 and the drain layer 10, both of which are formed thin with a thickness of 100 nm or so, and cause a problem of the leakage current.

In order to solve such a problem, Japanese Patent Application Laid-open No. 251967/1997 discloses a method of lowering the resistance. In this method, prior to the formation of a cobalt film, an amorphous layer is first formed in the upper section of an impurity diffusion layer on a silicon substrate by ion implantation, and then a cobalt film is formed over the impurity diffusion layer. Next, the cobalt film and silicon within the impurity diffusion layer are made to react each other by a first heat treatment at a relatively low temperature and, as a result, a cobalt silicide layer comprising CoSi or $Co_2Si$ is formed in the upper section of the amorphous layer. Following this, the unreacted cobalt is removed and then a second heat treatment is performed so as to turn CoSi or $Co_2Si$ into $CoSi_2$, and, thereby, to lower the resistance.

According to this disclosure, the amorphous layer prevents the constitutive elements of the cobalt silicide from moving downwards so that the generation of spikes can be suppressed.

However, in this method, it is difficult to control the conditions in such a way that the amorphous part is completely consumed. A part of amorphous tends to remain as lattice defects between the cobalt silicide layer and the source-drain layer, which leads to problems such as deterioration of transistor characteristics including the ON-current, and lowering of the reliability. While the amorphous part left as defects can be restored by annealing at high temperature, the temperature required for that normally exceeds 900° C. This causes the aggregation of cobalt silicide and lowers the heat resistance of the cobalt silicide film and, further, makes the electric resistance high again.

SUMMARY OF THE INVENTION

In light of the above problems, an object of the present invention is to provide a method of manufacturing a semiconductor device, in which the generation of spikes of cobalt silicide is suppressed and, thus, the leakage current is well-controlled so that good transistor characteristics as well as high reliability are attained.

The present invention is directed to a method of manufacturing a semiconductor device comprising the steps of forming a cobalt film over a silicon substrate in which an impurity diffusion layer is formed, and forming a cobalt silicide, by heat treatments, within a silicon layer which contact said cobalt film; wherein said heat treatments comprises the steps of: forming a $Co_2Si$ film by performing a first heat treatment at a temperature below 400° C.; and forming a $CoSi_2$ film by performing a second heat treatment.

Further, the present invention is directed to a method of manufacturing a semiconductor device comprising the steps of forming a cobalt film over a silicon substrate in which an impurity diffusion layer is formed, and forming a cobalt silicide, by heat treatments, within a silicon layer which contact said cobalt film; wherein said heat treatments comprises the steps of: forming a $Co_2Si$ film by performing a first heat treatment at a temperature below 400° C.; forming a CoSi film by performing a second heat treatment; and forming a $CoSi_2$ film by performing a third heat treatment.

Further, the present invention is directed to a method of manufacturing a semiconductor device comprising the steps of forming a cobalt film over a silicon substrate in which an impurity diffusion layer is formed, and forming a cobalt silicide, by heat treatments, within a silicon layer which contact said cobalt film; wherein said heat treatments comprises the steps of: forming a $Co_2Si$ film to a predetermined thickness by performing a first heat treatment over a period of 2 minutes or more; and forming a $CoSi_2$ film by performing a second heat treatment.

Further, the present invention relates to a method of manufacturing a semiconductor device comprising the steps of forming a cobalt film over a silicon substrate in which an impurity diffusion layer is formed, and forming a cobalt silicide, by heat treatments, within a silicon layer which contact said cobalt film; wherein said heat treatments comprises the steps of: forming a $Co_2Si$ film to a predetermined thickness by performing a first heat treatment over a period of 2 minutes or more; forming a CoSi film by performing a second heat treatment; and forming a $CoSi_2$ film by performing a third heat treatment.

In the present invention, "cobalt silicide" is used as a general name for $Co_2Si$, CoSi and $CoSi_2$.

BRIEF DESCRIPTION OF THE DRAWINGS

Following FIG. 1.

Following FIG. 2, FIG. 3 is schematic sectional views illustrating steps of a manufacturing method of the first embodiment.

Following FIG. 3, FIG. 4 is schematic sectional views illustrating steps of a manufacturing method of the first embodiment.

FIG. 5 is schematic sectional views illustrating steps of a manufacturing method of the second embodiment.

FIG. 6 is a schematic view illustrating the generation of spikes of cobalt silicide.

EXPLANATION OF SYMBOLS

1 . . . Silicon substrate

Figure 1A:
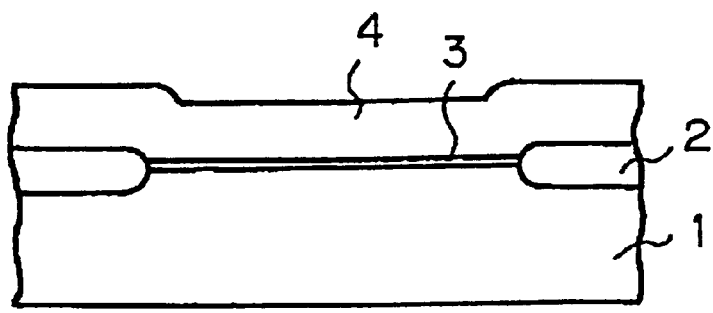
FIG. 1 is schematic sectional views illustrating steps of a manufacturing method of the first embodiment.

2 . . . LOCOS oxide film

3 ... Gate oxide film
4 ... Polysilicon film
5 ... Gate electrode
6 ... Impurity implantation layer
7 ... Sidewall
9 ... Source layer
10 ... Drain layer
12 ... Cobalt (Co) film
13 ... Titanium nitride (TiN) film
14 ... Silicon dioxide film
15 ... Gate bring-out electrode
16 ... Source bring-out electrode
17 ... Drain bring-out electrode
31 ... $Co_2Si$ film
32 ... $CoSi_2$ film
33 ... CoSi film
35 ... Cobalt silicide layer
36 ... Spikes of cobalt silicide

DETAILED DESCRIPTION OF THE INVENTION

As reactions of cobalt silicide formation between cobalt and silicon, there are known the following three reactions, appearing in turn, as the reaction temperature is raised from the low to the high.

At temperatures below or equal to about 450° C., $Co_2Si$ is produced from cobalt (Co) and silicon (Si). In this reaction, cobalt acts as a diffusion species and diffuses into the silicon side.

At temperatures about from 400° C. to 700° C., $Co_2Si$ further reacts with silicon and CoSi is formed. In this reaction, silicon acts as a diffusion species.

At temperatures about 700° C. or higher, CoSi further reacts with silicon and $CoSi_2$ is formed. In this reaction, cobalt acts as a diffusion species.

When the present inventors examined, in detail, the reaction of cobalt silicide formation in which cobalt and silicon interact, it was observed that the reaction proceeds very rapidly above 400° C. and that even at 400° C. a cobalt silicide film with a required thickness was formed within 30 seconds or so. It was then found that, in such a rapid reaction, CoSi is formed, together with $Co_2Si$, particularly at an interface on the side of the silicon substrate, which becomes the main factor to generate spikes. Further, it was found that, once CoSi is formed at the interface, spikes become apt to spring up so that, in order to suppress the generation of spikes, the first heat treatment must be performed under the conditions which do not allow the CoSi formation. Especially in the case of mass production, if a salicide process is used, formation of even a small amount of CoSi may result in a mass failure.

In the present invention, after a cobalt film is formed over impurity diffusion layers on a silicon substrate, a first heat treatment is carried out at a temperature below 400° C. and, therefore, a film of $Co_2Si$ is formed slowly to achieve the uniform film quality. In other words, in forming a $Co_2Si$ film, it is extremely important for the present invention to choose the right condition so as not to produce CoSi. Once this is achieved, the subsequent formation of $CoSi_2$ at a high temperature does not give rise to an abnormal growth, whether $CoSi_2$ is formed from $Co_2Si$ via CoSi or $CoSi_2$ is formed straight from $Co_2Si$. Therefore, an uniform $CoSi_2$ layer without spikes can be obtained.

Meanwhile, in Japanese Patent Application Laid-open No. 251967/1997, it is reported that abnormal growth occurred when a cobalt film was formed on a silicon substrate and then $Co_2Si$ was formed by heating at 400° C., CoSi was formed by heating at 450° C. and $CoSi_2$ was formed by further heating at 600° C. However, detailed examinations by the present inventors found that, even in such a close condition to the requisite for the present invention as at 400° C., homogeneous $Co_2Si$ could not be necessarily obtained, depending on the type and density of impurities in silicon, and that a trace of CoSi hindered the uniformity of $Co_2Si$. In contrast with this, the present invention does not give rise to abnormal growth, because the first heat treatment herein produces no CoSi.

In the present invention, the temperature of the first heat treatment is below 400° C. Since performing the heat treatment more slowly at a lower temperature allows the film of $Co_2Si$ to be formed more uniformly, it is still more preferable to set the temperature at or below 380° C. Further, if the temperature is too low, the reaction time becomes too long so that it is preferable to set the temperature at or above 300° C. and particularly preferable to set it at or above 320° C.

The time required to perform the first heat treatment may be adjusted, in consideration of the temperature, so that $Co_2Si$ may be formed to have a predetermined film thickness of, for example, 8~22 nm or so. For example, the heat treatment at 300° C. requires to perform for 60~90 minutes or so, while the heat treatment at 350° C. does for 30 minutes or so. For example, in order to form $Co_2Si$ to have a film thickness of 8~22 nm or so ( for example, 15 nm), it is preferable to spend 2 minutes or more, and particularly preferable to spend 10 minutes or more.

Regarding an equipment utilized for the first heat treatment, there is no special requirement. For instance, either a heat treatment in a standard electric furnace or an RTA (rapid thermal annealing) treatment may be employed. However it is preferable to use an electric furnace so that $Co_2Si$ may be formed uniformly without producing CoSi, by carrying out the heat treatment therein at a relatively low temperature for a long time.

As for the atmosphere for the heat treatment, the one without oxygen is preferable. The heat treatment is preferably performed in the inert atmosphere such as nitrogen, argon or the like.

In the present invention, after $Co_2Si$ is formed uniformly in this way, unreacted cobalt is removed and then $CoSi_2$ is produced by another heat treatment at a temperature in a range of 700~900° C. In this case, if the temperature exceeds 900° C., $CoSi_2$ tends to aggregate which may deteriorate the heat resistance and increase the electric resistance. The heat treatment to produce $CoSi_2$ is preferably performed rapidly so that the use of the RTA method is preferred. When $Co_2Si$ is formed to have a film thickness of 8~22 nm or so by the first heat treatment as described above, a film thickness for $CoSi_2$ becomes 20~50 nm or so.

In the present invention, in order to improve the uniformity further, a separate step may be taken for respective diffusion species. This can facilitate to form a cobalt silicide film with a still higher orientation of the atoms and heat resistance.

That is, after $Co_2Si$ is formed by a first heat treatment in the same way as described above, CoSi is produced by a second heat treatment performed at 400~700° C., and thereafter a third heat treatment is further performed at 700~900° C. to produce $CoSi_2$. In this case, the removal of unreacted cobalt is preferably carried out after the formation of CoSi. Since CoSi has normally a larger etching selectivity ratio to cobalt than that of $Co_2Si$ to cobalt, the above arrangement widens the choice of etchant for the removal. When the heat treatment is performed in three steps like this, if $Co_2Si$ is formed to have a thickness of 8~22 nm or so by the first heat treatment, CoSi is to have a thickness of 11~29 nm or so and $CoSi_2$ is to have a thickness of 20~50 nm or so.

Further, another aspect of the present invention is characterized by a heat treatment which is performed to form a $Co_2Si$ film to a predetermined thickness as a first heat treatment over a period of 2 minutes or more. That is, what is important in this aspect is that it takes 2 or more minutes to form slowly a $Co_2Si$ film to a predetermined thickness from the reaction between cobalt and silicon. It is particularly preferable that 10 or more minutes are spent as the time for this heat treatment. Further, the predetermined film thickness as referred herein is a film thickness of 8~22 nm or so, as described above, and a temperature below 400° C. is normally utilized for this heat treatment.

Further, if the time for the heat treatment is set too long, the manufacturing efficiency becomes rather poor. Therefore it is preferable to set it within an admissible time range for a manufacturing step. For example, this heat treatment may be completed within 90 minutes.

As for an equipment for this heat treatment, the same equipment as the one for the afore-mentioned aspect in which the first heat treatment is carried out below 400° C. can be utilized. Other conditions and the subsequent treatments can be set in the same way as described.

Referring now to specific embodiments, the present invention is further described in detail.

First Embodiment

Referring to FIG. 1~FIG. 4, manufacturing steps of the present embodiment is described. First, as shown in FIG. 1(a), the surface of a region divided by a LOCOS oxide film 2 within a silicon substrate 1 is subjected to thermal oxidation and a gate oxide film 3 is formed to a thickness of 3~10 nm or so. Then, over the gate oxide film 3 and the LOCOS oxide film 2, a polysilicon film 4 is formed to a thickness of 100~300 nm or so by the CVD (chemical vapour deposition) method.

Figure 1B:
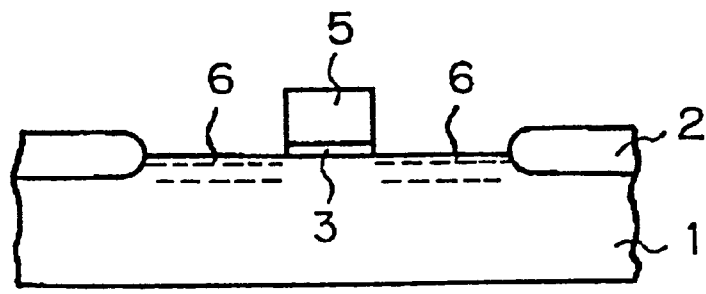

Next, as shown in FIG. 1(b), impurities such as arsenic are injected into the polysilicon film 4 by means of ion implantation and thereafter, by patterning the polysilicon film 4 and the gate oxide film 3, a gate electrode 5 is formed from the gate polysilicon film 4. Following this, an impurity implantation layer 6 is formed by injecting, for example, arsenic into the silicon substrate 1 by means of ion implantation, using the gate electrode as a mask. A dose and an accelerating energy for the ion implantation are adjusted appropriately to fit the design of elements. For example, the ion implantation is carried out under the condition that an accelerating energy is 20~60 keV and a dose is $1~5\times10^{15}$ atm/$cm^2$.

Further, the ion implantation may be performed in two stages, one implantation into a relatively shallow part and the other one into a deeper part. In practice, for example, the first condition is set to be a dose of $3\times10^{14}$ atm/$cm^2$ and an accelerating energy of 10 keV, and the second condition, a dose of $2\times10^{15}$ atm/$cm^2$ and an accelerating energy of 40 keV. This second ion implantation may be performed after a sidewall to a gate electrode is formed in the next step.

Figure 1C:
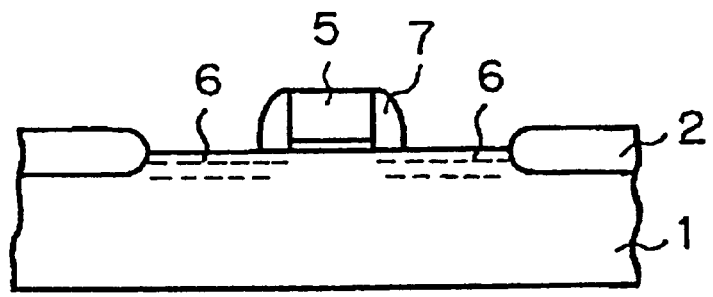

Next, a silicon dioxide film is formed to a thickness of 100 nm or so by the CVD method. Subsequently, the silicon dioxide film is subjected to a vertical anisotropic etching till the upper face of the gate electrode 5 is exposed in such a way that the silicon dioxide film is left as a sidewall 7 on the side of the gate electrode 5, as shown in FIG. 1(c).

Figure 1D:
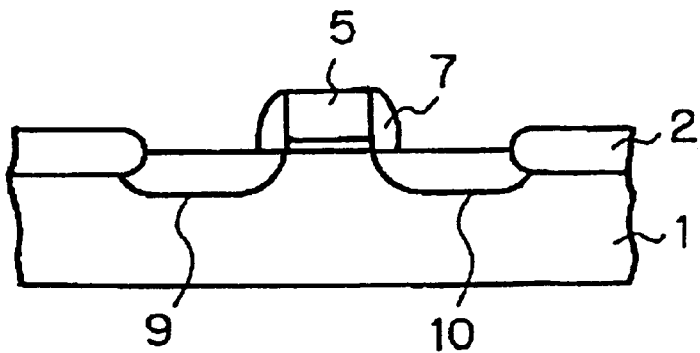

Next, as shown in FIG. 1(d), an RTA treatment at 1000° C. is carried out for 10 seconds so that arsenic within the gate electrode 5 is diffused inwards, and at the same time, arsenic in the impurity implantation layer 6 is activated and thereby a source layer 9 and a drain layer 10 are formed as impurity diffusion layers. The depth of the source layer 9 and the drain layer 10 is, for example, 100 nm or so (normally 80~150 nm or so) from the surface of the silicon substrate 1.

Figure 2A:
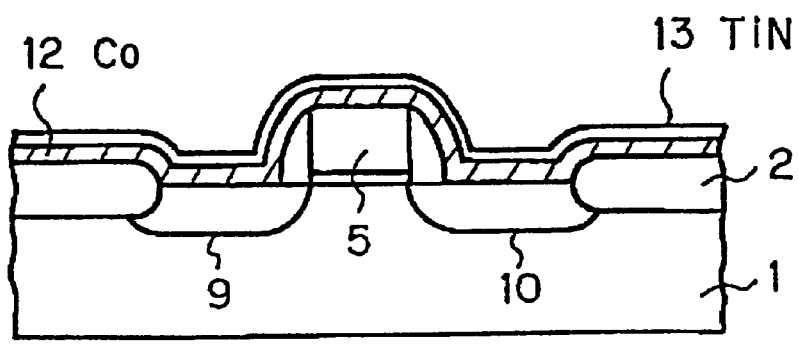
FIG. 2 is schematic sectional views illustrating steps of a manufacturing method of the first embodiment.

Next, as shown in FIG. 2(a), a cobalt (Co) film 12 is formed to a thickness of, for example, 10 nm (normally 5~20 nm or so) by the sputtering method and further a titanium nitride (TiN) film 13 is formed thereon to a thickness of, for example, 10 nm. The titanium nitride film may be grown using nitrogen plasma with a titanium target. The titanium nitride film herein functions as a barrier film against oxygen. In the present invention, it is particularly preferable to form such a barrier film against oxygen on the surface of cobalt, since the time period for the heat treatment at the next manufacturing step is rather long. In addition to a titanium nitride film, a titanium film, a tungsten film, a titanium-tungsten film and the like can be utilized as a barrier film against oxygen, but, in respect of etching removability and little oxygen permeability, the use of a titanium nitride film is the most preferable.

Figure 2B:
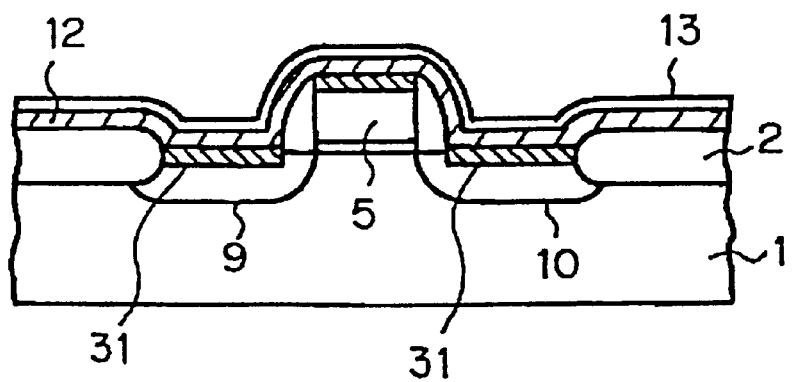

Next, this substrate is subjected to a first heat treatment in an electric furnace at an appropriate temperature below 400° C. for a predetermined time (for example, at 300° C. for 1 hour) and thereby a $Co_2Si$ film 31 is formed to a thickness of 15nm or so, as shown in FIG. 2(b).

Next, using a mixed solution of sulfuric acid and hydrogen peroxide, the titanium nitride film 13 and the unreacted cobalt film 12 are removed. At this, the $Co_2Si$ film 31 remains as it is, without being etched, as shown in FIG. 3(a).

Next, a second heat treatment is carried out by the RTA method at an appropriate temperature in a range of 700~900° C. (for example, at 750° C.), and thereby the $Co_2Si$ film 31 is turned into a $CoSi_2$ film 32 with a thickness of 35 nm or so, as shown in FIG. 3(b).

After this, as shown in FIG. 4, in the same way as the conventional semiconductor device, a silicon dioxide film 14 is formed to a thickness of 700 nm or so over the entire surface by the CVD method, and then, by patterning the silicon dioxide film 14, contact holes are formed on the gate electrode 5, the source layer 9 and the drain layer 10 and thereafter a gate bring-out electrode 15, a source bring-out electrode 16 and a drain bring-out electrode 17 are formed. These bring-out electrodes may be constituted as layered films or the like, comprising, for example, from the bottom, a titanium film with a thickness of 20 nm, a titanium nitride film with a thickness of 100 nm and an aluminum layer with a thickness of 500 nm.

In a semiconductor device manufactured in accordance with the present embodiment, no spikes are generated from cobalt silicide or no problems of the junction leakage are observed.

Second Embodiment

Referring to FIG. 1, FIG. 2, FIG. 5 and FIG. 4 in this order, the present embodiment is described. In this embodiment, after a gate electrode, a sidewall, a source layer and a drain layer are formed as in the first embodiment, a cobalt film and a titanium nitride film are formed as in the first embodiment, which accomplishes manufacturing steps from FIG. 1 to FIG. 2(a).

Next, as shown in FIG. 2(b), as in the first embodiment, a first heat treatment is performed in an electric furnace at 300° C. for 1 hour, forming a $Co_2Si$ film 31 to a thickness of 15 nm or so.

Next, as shown in FIG. 5(a), a second heat treatment is performed either in an electric furnace or in an RTA equipment at an appropriate temperature in a range of 400~700° C. (for example, at 550° C.), turning the $Co_2Si$ film 31 into a CoSi film 33. The film thickness of the CoSi film is 20 nm or so.

Next, using a mixed solution of sulfuric acid and hydrogen peroxide, the titanium nitride film 13 and the unreacted cobalt film 12 are removed. At this, the CoSi film 33 remains as it is, without being etched, as shown in FIG. 5(b). As the solution in this step, in addition to a mixed solution of sulfuric acid and hydrogen peroxide, a mixed solution of hydrochloric acid and hydrogen peroxide and a mixed solution of ammonia and hydrogen peroxide may be used.

Next, a third heat treatment is performed by the RTA method at an appropriate temperature in a range of 700~900° C. and higher than the temperature for the second heat treatment, turning the CoSi film 33 into a $CoSi_2$ film 32, as shown in FIG. 5(c). The film thickness of the $CoSi_2$ film is 35 nm or so. After this, a semiconductor device shown in FIG. 4 is obtained as in the first embodiment.

In this embodiment, the formation of cobalt silicide is proceeded step by step, with each step being accomplished thoroughly, so that $CoSi_2$ obtained in this embodiment has a good uniformity and an excellent heat resistance as well as the effects of the first embodiment. Therefore the junction leakage can be prevented still more effectively. Additionally, because the unreacted cobalt film is removed in this embodiment after the CoSi film is formed, a milder etching solution can be used for this purpose. Thus other parts of the semiconductor device are not damaged.

According to the present invention, there can be provided a method of manufacturing a semiconductor device, in which the generation of spikes of cobalt silicide is suppressed and, thus, the leakage current is wellcontrolled so that good transistor characteristics as well as high reliability are attained.

What is claimed is:

1. A method of manufacturing a semiconductor device comprising the steps of forming a cobalt film over a silicon substrate in which an impurity diffusion layer is formed, and forming a cobalt silicide, by heat treatments, within a silicon layer which contact said cobalt film;

wherein said heat treatments include the steps of:
    forming a $Co_2Si$ film to a predetermined thickness by performing a first heat treatment over a period of 2 minutes or more at a temperature in a range of 320° C. to 380° C.; and
    forming a $CoSi_2$ film by performing a second heat treatment.

2. A method of manufacturing a semiconductor device according to claim 1, wherein a step of removing an unreacted cobalt film is performed during forming said $Co_2Si$ film.

3. A method of manufacturing a semiconductor device according to claim 1, further comprising a step of covering the surface of said cobalt film with a barrier film against oxygen.

4. A method of manufacturing a semiconductor device according to claim 3 wherein said barrier film against oxygen is a titanium nitride film.

5. A method of manufacturing a semiconductor device according to claim 3, wherein said barrier film against oxygen is a titanium-tungsten film.

6. A method of manufacturing a semiconductor device according to claim 3, wherein said barrier film against oxygen is a tungsten film.

7. A method of manufacturing a semiconductor device according to claim 1, wherein a first heat treatment to form said $Co_2Si$ film is performed in an electric furnace.

8. A method of manufacturing a semiconductor device comprising the steps of forming a cobalt film over a silicon substrate in which an impurity diffusion layer is formed, and forming a cobalt silicide, by heat treatments, within a silicon layer which contact said cobalt film;

wherein said heat treatments include the steps of:
    forming a $Co_2Si$ film to a predetermined thickness by performing a first heat treatment over a period of 2 minutes or more at a temperature below 400° C.;
    forming a CoSi film by performing a second heat treatment; and
    forming a $CoSi_2$ film by performing a third heat treatment.

9. A method of manufacturing a semiconductor device according to claim 8, wherein a step of removing an unreacted cobalt film is performed during formation of said CoSi film.

10. A method of manufacturing a semiconductor device according to claim 8, further comprising a step of covering the surface of said cobalt film with a barrier film against oxygen.

11. A method of manufacturing a semiconductor device according to claim 10, wherein said barrier film against oxygen is a titanium nitride film.

12. A method of manufacturing a semiconductor device according to claim 10, wherein said barrier film against oxygen is a titanium-tungsten film.

13. A method of manufacturing a semiconductor device according to claim 10, wherein said barrier film against oxygen is a tungsten film.

14. A method of manufacturing a semiconductor device according to claim 8, wherein a first heat treatment to form said $Co_2Si$ film is performed in an electric furnace.

* * * * *